(12) United States Patent
Iwata

(10) Patent No.: US 12,278,200 B2
(45) Date of Patent: Apr. 15, 2025

(54) SEMICONDUCTOR ELEMENT, APPARATUS, AND CHIP

(71) Applicant: CANON KABUSHIKI KAISHA, Tokyo (JP)

(72) Inventor: Junji Iwata, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 473 days.

(21) Appl. No.: 17/579,082

(22) Filed: Jan. 19, 2022

(65) Prior Publication Data

US 2022/0238470 A1 Jul. 28, 2022

(30) Foreign Application Priority Data

Jan. 22, 2021 (JP) ................. 2021-008441

(51) Int. Cl.
*H01L 27/144* (2006.01)
*H01L 23/00* (2006.01)
*H01L 27/146* (2006.01)

(52) U.S. Cl.
CPC .............. *H01L 24/06* (2013.01); *H01L 24/49* (2013.01); *H01L 27/1446* (2013.01); *H01L 27/14636* (2013.01); *H01L 24/04* (2013.01); *H01L 24/05* (2013.01); *H01L 24/08* (2013.01); *H01L 24/09* (2013.01); *H01L 24/48* (2013.01); *H01L 27/14634* (2013.01); *H01L 2224/04042* (2013.01); *H01L 2224/05541* (2013.01); *H01L 2224/05548* (2013.01); *H01L 2224/06165* (2013.01); *H01L 2224/08145* (2013.01); *H01L 2224/09181* (2013.01);
(Continued)

(58) Field of Classification Search
CPC . H01L 2224/06165; H01L 2224/04042; H01L 24/04; H01L 24/49; H01L 27/14636; H01L 31/107; H01L 31/02027; H01L 31/02327; H01L 31/022416; H01L 31/0232
See application file for complete search history.

(56) References Cited

U.S. PATENT DOCUMENTS

2009/0289357 A1* 11/2009 Fujimoto .......... H01L 23/49838
257/E23.06
2010/0252830 A1* 10/2010 Osajima .............. H01L 27/0203
257/E23.179
2015/0301180 A1 10/2015 Stettner
(Continued)

FOREIGN PATENT DOCUMENTS

JP 2014160042 A 9/2014
JP 2017028690 A 2/2017
(Continued)

*Primary Examiner* — Jaehwan Oh
(74) *Attorney, Agent, or Firm* — Canon U.S.A., Inc. IP Division

(57) ABSTRACT

A semiconductor element including an array in which a plurality of avalanche photodiodes is arranged includes a plurality of first electrodes configured to receive supply of a first voltage to be used by the plurality of avalanche photodiodes from outside, and at least one second electrode configured to receive supply of a second voltage from outside different from the first voltage. The plurality of first electrodes and the at least one second electrode are disposed outside the array. The at least one second electrode is disposed between one and another one of the plurality of first electrodes.

18 Claims, 16 Drawing Sheets

(52) U.S. Cl.
CPC .............. *H01L 2224/48227* (2013.01); *H01L 2224/49113* (2013.01); *H01L 2224/49171* (2013.01)

(56) References Cited

U.S. PATENT DOCUMENTS

| | | | | |
|---|---|---|---|---|
| 2016/0181293 | A1* | 6/2016 | McGarvey | H01L 24/73 257/438 |
| 2022/0014701 | A1* | 1/2022 | Kabe | H01L 27/14612 |
| 2022/0336504 | A1* | 10/2022 | Kitano | H01L 27/1461 |
| 2023/0132945 | A1* | 5/2023 | Otake | H01L 27/14629 257/186 |

FOREIGN PATENT DOCUMENTS

| | | | |
|---|---|---|---|
| JP | 2019140524 | A | 8/2019 |
| JP | 2020096158 | A | 6/2020 |
| JP | 2020161736 | A | 10/2020 |
| WO | 2020195781 | A1 | 10/2020 |
| WO | WO-2022210149 | A1 * | 10/2022 |

\* cited by examiner

SEMICONDUCTOR ELEMENT, APPARATUS, AND CHIP

BACKGROUND

Field of the Disclosure

The aspect of the embodiments relates to semiconductor elements, apparatuses, and chips.

Description of the Related Art

There are known photoelectric conversion elements capable of detecting weak light at a single-photon level using avalanche (electronic avalanche) multiplication. Japanese Patent Application Laid-Open No. 2020-96158 discusses a configuration including an avalanche photodiode and pad electrodes for supplying a voltage to the avalanche photodiode.

SUMMARY OF THE DISCLOSURE

According to an aspect of the disclosure, a semiconductor element including an array in which a plurality of avalanche photodiodes is arranged includes a plurality of first electrodes configured to receive supply of a first voltage to be used by the plurality of avalanche photodiodes from outside, and at least one second electrode configured to receive supply of a second voltage from outside different from the first voltage. The plurality of first electrodes and the at least one second electrode are disposed outside the array. The at least one second electrode is disposed between one and another one of the plurality of first electrodes.

Further features of the disclosure will become apparent from the following description of exemplary embodiments with reference to the attached drawings.

DESCRIPTION OF THE EMBODIMENTS

Figure 1:
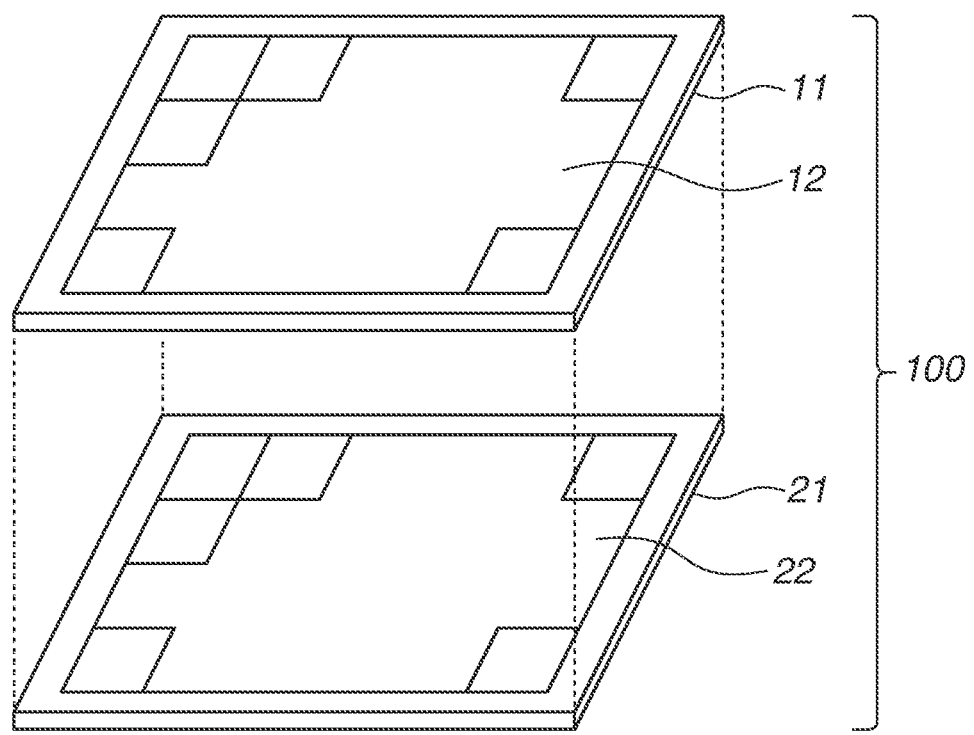
FIG. 1 is an overall view of a semiconductor element.

There is room to analyze the layout of pad electrodes discussed in Japanese Patent Application Laid-Open No. 2020-96158. A high voltage enough to cause avalanche multiplication should be supplied to the avalanche photodiode. Further, more avalanche photodiodes become likely to cause differences in voltages supplied to a plurality of avalanche photodiodes. Such differences may lead to differences in signal linearity (an output signal value corresponding to a quantity of incident light) among the avalanche photodiodes.

The following is a description of a technique suitable for voltages supplied to avalanche photodiodes and also of supplying higher stable power source voltages to the more avalanche photodiodes.

The exemplary embodiments that will be described below are intended to embody the technical idea of the disclosure, and are not intended to limit the disclosure thereto. The sizes and the positional relationship of members illustrated throughout the drawings may be exaggerated for a clear description. In the following description, like numbers refer to like components and the descriptions thereof may be omitted.

The following description will center on semiconductor elements. Semiconductor elements can be used as an image pickup element (an image sensor) for forming images. Further, other examples of semiconductor elements include a ranging element (a sensor for, for example, measuring distances using focus detection or Time of Flight (TOF)), a light metering element (a sensor for, for example, measuring the quantity of incident light), and a light detection and ranging (LiDAR) sensor. The exemplary embodiments that will be described below can be applied to general semiconductor elements.

A configuration common to respective semiconductor elements according to the exemplary embodiments will be described with reference to FIGS. 1 to 4. The semiconductor element includes a single photon avalanche diode (SPAD) pixel including an avalanche photodiode. A conductivity type corresponding to the polarity of the charge used as a signal charge of a charge pair created in the avalanche photodiode will be referred to as a first conductivity type. The first conductivity type refers to a conductivity type in which charges having the same polarity as a signal charge serve as majority carries.

Further, a conductivity type opposite to the first conductivity type will be referred to as a second conductivity type. In the following description, the semiconductor element will be described citing an example in which the signal charge is electrons, and the first conductivity type and the second conductivity type are a negative (N) type and a positive (P) type, respectively. Alternatively, the signal charge, the first conductivity type, and the second conductivity type may be holes, the P type, and the N type, respectively.

In the present specification, a "planar view" will refer to a view in the direction perpendicular to the light incident surface of a semiconductor substrate that will be described below. Further, a "cross-section" will refer to a section taken along the direction perpendicular to the light incident surface of a semiconductor layer 302 of a sensor board 11. If the light incident surface of the semiconductor layer is a rough surface microscopically, the planar view will be defined based on the light incident surface of the semiconductor layer macroscopically.

In the present specification, a depth direction will refer to the direction from the light incident surface (a first surface) of the semiconductor layer 302 toward the surface where a circuit board 21 is disposed (a second surface).

First, the configuration common to the exemplary embodiments will be described.

FIG. 1 illustrates the configuration of a lamination-type semiconductor element 100 according to the present exemplary embodiments. In the semiconductor element 100, two boards, namely, the sensor board 11 and the circuit board 21 are laminated and electrically connected to each other. The sensor board 11 includes a first semiconductor layer including photoelectric conversion elements 102, which will be described below, and a first wiring structure. The circuit board 21 includes a second semiconductor layer with a circuit including signal processing units 103, which will be described below, and a second wiring structure. The semiconductor element 100 has the second semiconductor layer, the second wiring structure, the first wiring structure, and the first semiconductor layer laminated in that order. The respective semiconductor elements that will be described in the exemplary embodiments are so-called back-side illuminated semiconductor elements, in which light is incident on the first surface and the circuit board is disposed on the second surface.

The sensor board 11 and the circuit board 21 will be described as diced chips in the following description, but are not limited to chips. For example, boards may be wafers. Further, wafer boards may be laminated and then diced or boards in chip forms may be laminated and bonded together.

A pixel region 12 is disposed on the sensor board 11, and a circuit region 22, which processes signals detected by the pixel region 12, is disposed on the circuit board 21.

Figure 2:
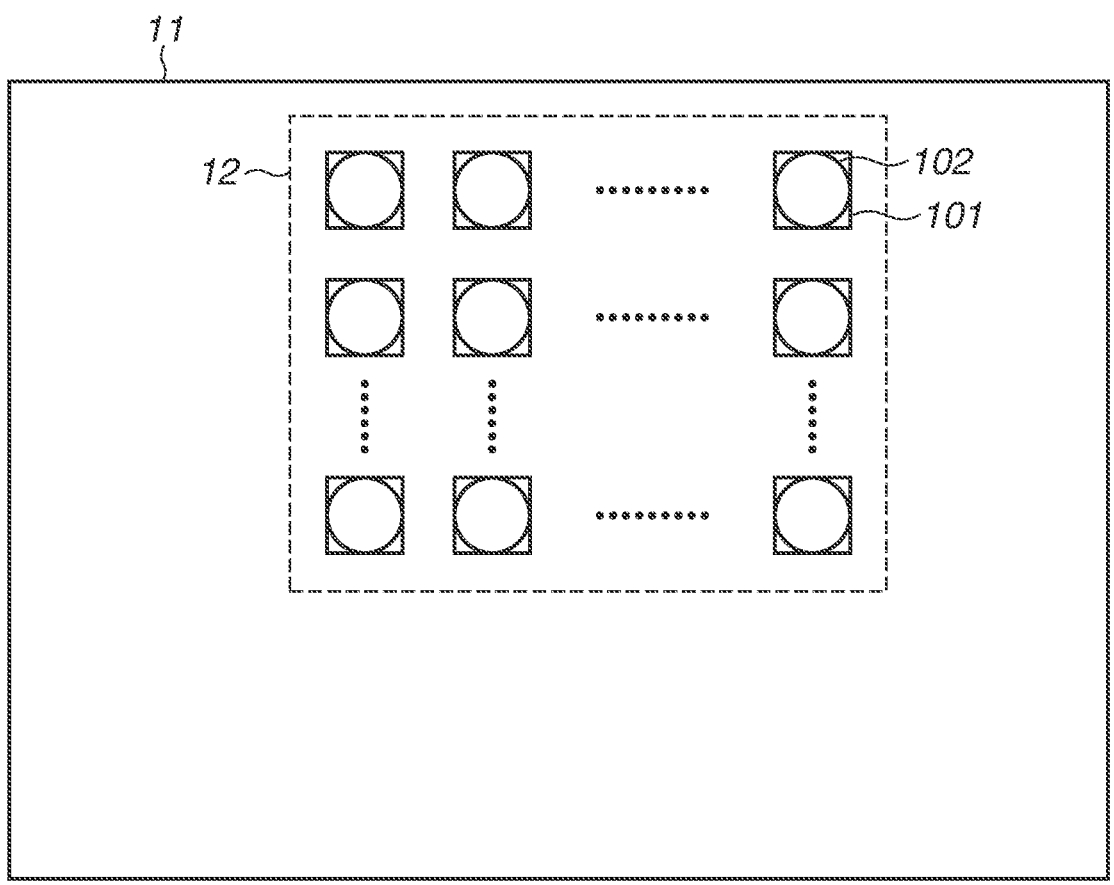
FIG. 2 is a plan view of the semiconductor element.

FIG. 2 illustrates a layout example of the sensor board 11. Pixels 101 each equipped with the photoelectric conversion element 102 including an avalanche photodiode (hereinafter referred to as an APD) are arranged in a two-dimensional array in the planar view, and forms the pixel region 12.

Each pixel 101 is typically a pixel for forming images, but may not form images when the semiconductor element 100 is used in TOF. In other words, each pixel 101 may be a pixel for measuring a time at which light arrives and the quantity of light.

Figure 3:
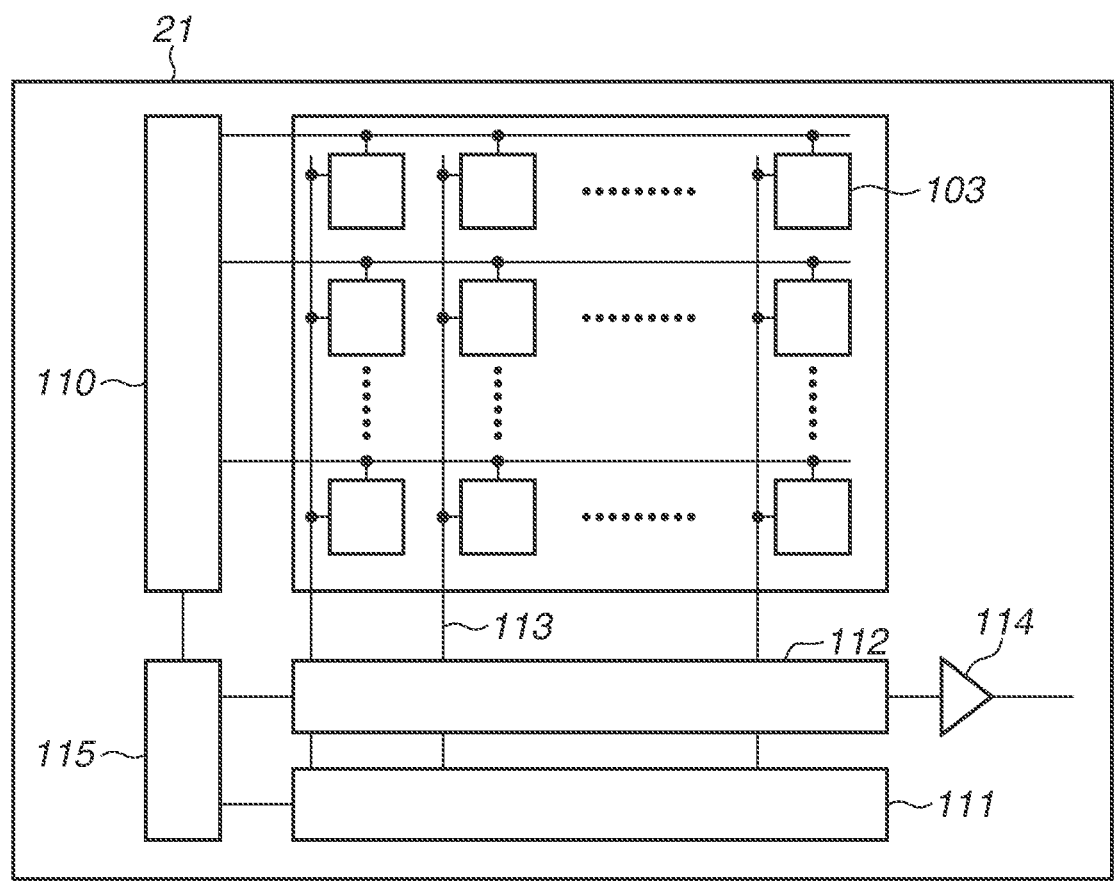
FIG. 3 is an overall view of the semiconductor element.

FIG. 3 illustrates the configuration of the circuit board 21. The circuit board 21 includes signal processing units 103, which processes charge photoelectrically converted by the photoelectric conversion element 102 in FIG. 2, a readout circuit 112, a control pulse generation unit 115, a horizontally scanning circuit unit 111, signal lines 113, and a vertical scanning circuit unit 110.

Each photoelectric conversion element 102 in FIG. 2 and each signal processing unit 103 in FIG. 3 are electrically connected to each other via connection wiring provided per pixel.

The vertical scanning circuit unit 110 receives control pulses fed from the control pulse generation unit 115, and feeds them to each pixel. Logical circuits such as shift registers and address decoders are used for the vertical scanning circuit unit 110.

Signals output from the photoelectric conversion elements 102 of each pixel 101 are processed by the corresponding signal processing unit 103. A counter, a memory, and other components are provided to the signal processing unit 103, and digital values are held in the memory.

The horizontally scanning circuit unit 111 inputs control pulses for sequentially selecting a column to the signal processing units 103 to read out digital signals from the memory of each pixel 101.

Signal are output from the signal processing unit 103 of a pixel selected by the vertical scanning circuit unit 110 to the signal line 113 in a selected column.

Signals output to the signal line 113 are output to a recording unit or a signal processing unit outside the semiconductor element 100 via an output circuit 114.

In FIG. 2, the layout of the photoelectric conversion elements 102 in the pixel region 12 may be arranged one-dimensionally. The functions of each signal processing unit 103 may not be provided to all of the photoelectric conversion elements 102, and, for example, one signal processing unit 103 may be shared by a plurality of photoelectric conversion elements 102 for sequential signal processing.

As illustrated in FIGS. 2 and 3, the signal processing units 103 are disposed in a region overlapping the pixel region 12 in the planar view. Then, the vertical scanning circuit unit 110, the horizontally scanning circuit unit 111, the column circuit 112, the output circuit 114, and the control pulse generation unit 115 are disposed over the region between the edges of the sensor board 11 and the pixel region 12 in the planar view. In other words, the sensor board 11 includes the pixel region 12 and a non-pixel region disposed around the pixel region 12, and on the region over the non-pixel region in the planar view, the vertical scanning circuit unit 110, the horizontally scanning circuit unit 111, the column circuit 112, the output circuit 114, and the control pulse generation unit 115 are disposed.

Figure 4:
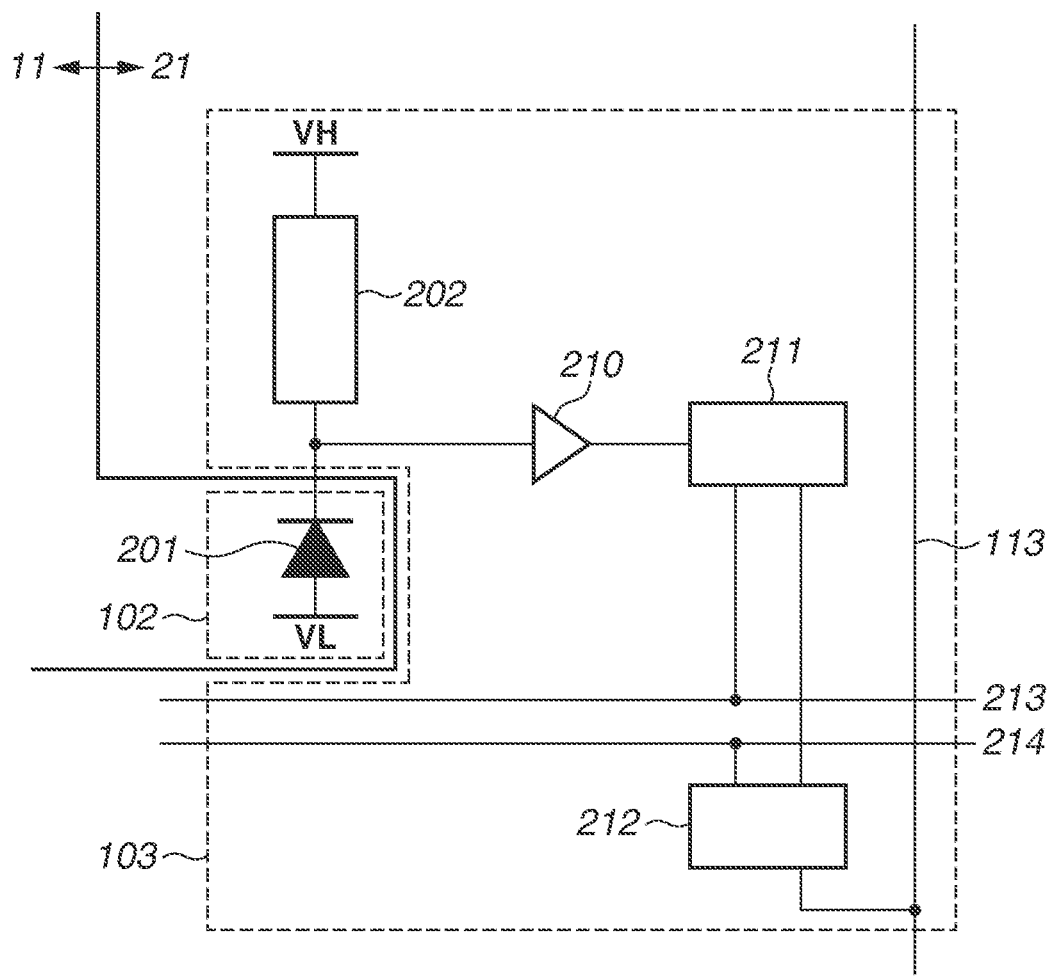
FIG. 4 illustrates the configuration of a pixel.

FIG. 4 is an example of a block diagram including an equivalent circuit for the configurations of FIGS. 2 and 3.

In FIG. 2, each photoelectric conversion element 102 with the APD 201 is mounted on the sensor board 11, and the other components are mounted on the circuit board 21.

The APD 201 produces charge pairs corresponding to incident light through photoelectric conversion. A voltage VL (a first voltage) is supplied to the anode of the APD 201. Further, a voltage VH (a second voltage) higher than the voltage VL supplied to the anode is supplied to the cathode of the APD 201. A reverse bias voltage to the anode is supplied to the cathode to allow the APD 201 to cause avalanche multiplication. Such voltages applied thereto allows the charge pairs produced by incident light to cause avalanche multiplication to produce an avalanche current.

There are two modes with a reverse bias voltage supplied: one is the Geiger mode, in which the APD is operated with the potential difference between the anode and the cathode greater than the breakdown voltage, and the other is the linear mode, in which the APD is operated with the potential difference between them close to or smaller than the breakdown voltage.

An APD operated in the Geiger mode will be referred to as an SPAD. For example, the voltage VL (the first voltage) is −30 V, and the voltage VH (the second voltage) is 1 V. Such an APD receives a high voltage compared to a photodiode not used to cause avalanche multiplication. The APD 201 may be in operation in the linear mode or in the Geiger mode. An SPAD has a higher potential difference compared to an APD in the linear mode, providing a remarkable withstand voltage, and it thus is suitable that the APD 201 is an SPAD.

A quenching element 202 is connected to the power source that supplies the voltage VH and the APD 201. The quenching element 202 functions as a load circuit (a quenching circuit) in signal multiplication caused by avalanche multiplication, and serves to curb the voltage to be supplied to the APD 201 to give lower avalanche multiplication (a quenching action). Further, the quenching element 202 serves to return the voltage to be supplied to the APD 201 to the voltage VH by flowing a current by the amount corresponding to a voltage drop due to the quenching action (recharging action).

Each signal processing unit 103 includes a waveform shaping unit 210, a counter circuit 211, and a selection circuit 212. In the present specification, each signal processing unit 103 may include the waveform shaping unit 210, the counter circuit 211, or the selection circuit 212.

The waveform shaping unit 210 forms variations in the potential of the cathode of the APD 201 acquired at photon detection into pulse signals to output. For example, an inverter circuit is used as the waveform shaping unit 210. FIG. 4 illustrates an example in which one inverter is used as the waveform shaping unit 210, but a circuit of a plurality of inverters in series or another circuit that has a waveform shaping effect may be used as the waveform shaping unit 210.

The counter circuit 211 counts pulse signals output from the waveform shaping unit 210, and holds count values. Further, when a control pulse pRES is fed via a driving line 213, a signal held in the counter circuit 211 is reset.

The selection circuit 212 receives a control pulse pSEL fed from the vertical scanning circuit unit 110 in FIG. 3 via a driving line 214 in FIG. 4 (not illustrated in FIG. 3) to switch to electrically connect or disconnect the counter circuit 211 and the signal line 113. The selection circuit 212 includes, for example, a buffer circuit for outputting signals.

A switch such as a transistor may be disposed to switch to electrically connect or disconnect the quenching element 202 and the APD 201 or the photoelectric conversion element 102 and the signal processing unit 103. Similarly, a switch such as a transistor may be disposed to switch the supply of the voltage VH or the voltage VL to be applied to the photoelectric conversion element 102.

In the present exemplary embodiments, the configuration using the counter circuit 211 has been described. However, the semiconductor element 100 may be configured to acquire a pulse detection timing using a time-digital conversion circuit (Time to Digital Converter: hereinafter referred to as a TDC) and a memory instead of the counter circuit 211. In this case, a timing of a pulse signal output from the waveform shaping unit 210 is converted into a digital signal by the TDC. A control pulse pREF (a reference signal) is fed from the vertical scanning circuit unit 110 of FIG. 3 to the TDC via a driving line in timing measurement of the pulse signal. The TDC acquires a digital signal as an input timing of a signal output from each of the pixels 101 via the waveform shaping unit 210, the input timing of which is expressed in a relative time with reference to the control pulse pREF.

Figure 5A:
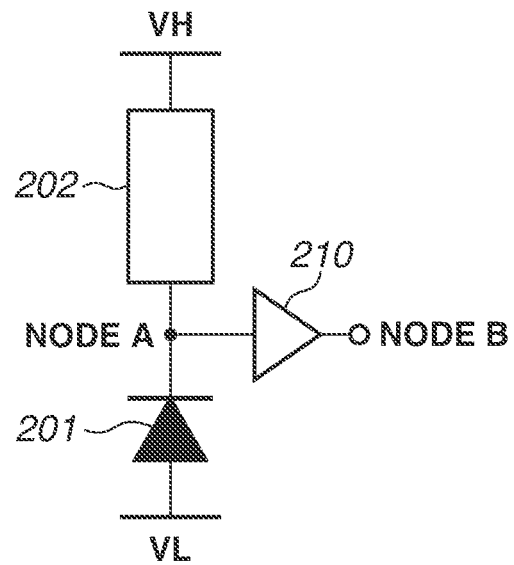
FIGS. 5A to 5C illustrate the configuration and the operation of the pixel.
Figure 5B:
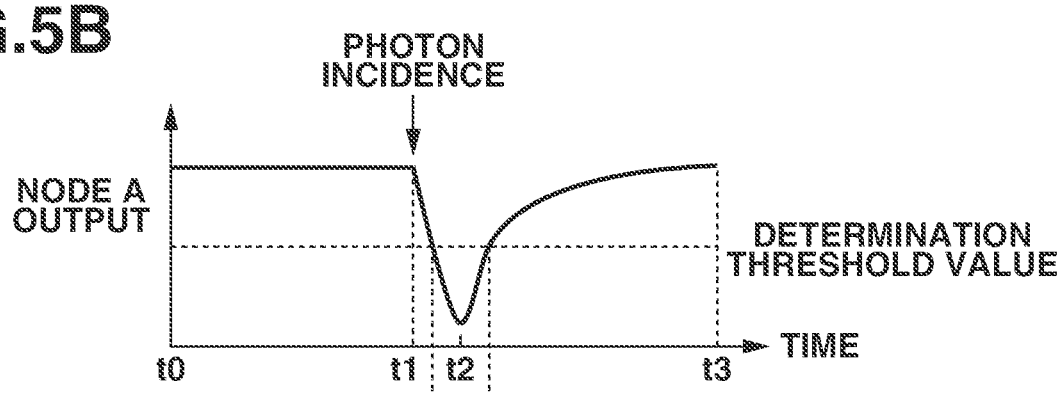
Figure 5C:
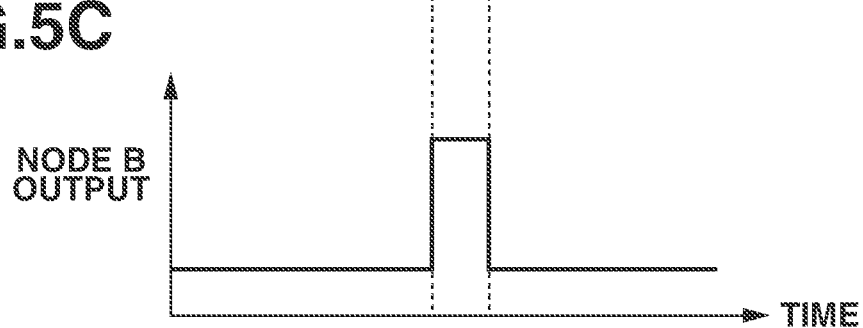

FIGS. 5A to 5C schematically illustrate a relationship between the operation of the APD 201 and an output signal.

The APD 201, the quenching element 202, and the waveform shaping unit 210 in FIG. 4 are extracted in the illustration of FIG. 5A. Then, a node A and a node B are the input and the output of the waveform shaping unit 210. FIG. 5B and FIG. 5C illustrate a change in waveform at the node A in FIG. 5A and a change in waveform at the node B in FIG. 5A, respectively.

The potential difference VH−VL is applied to the APD 201 in FIG. 5A during the period from time t0 to time t1. When photons are incident on the APD 201 at time t1, that causes avalanche multiplication in the APD 201, and an avalanche multiplication current flows to the quenching element 202, lowering the voltage at the node A. The voltage is dropping until the potential difference is low, causing the avalanche multiplication to stop in the APD 201 at time t2, which means that the voltage level at the node A will not drop beyond a certain level. After that, a current that will compensate for the voltage drop flows from the voltage VL to the node A during the period from time t2 to time t3, causing the voltage at the node A stable at the original voltage level at time t3. The part of the output waveform exceeding a certain threshold value at the node A undergoes waveform shaping by the waveform shaping unit 210 and is output as a signal at the node B.

The layout of the output lines 113, and the layout of the column circuit 112 and the output circuit 114 are not limited to that of FIG. 3. For example, the output lines 113 may extend in the row direction and the column circuit 112 may be disposed over the ends of the output lines 113.

In the following description, the respective semiconductor elements according to the exemplary embodiments will be described.

A first exemplary embodiment will be described.

Figure 6:
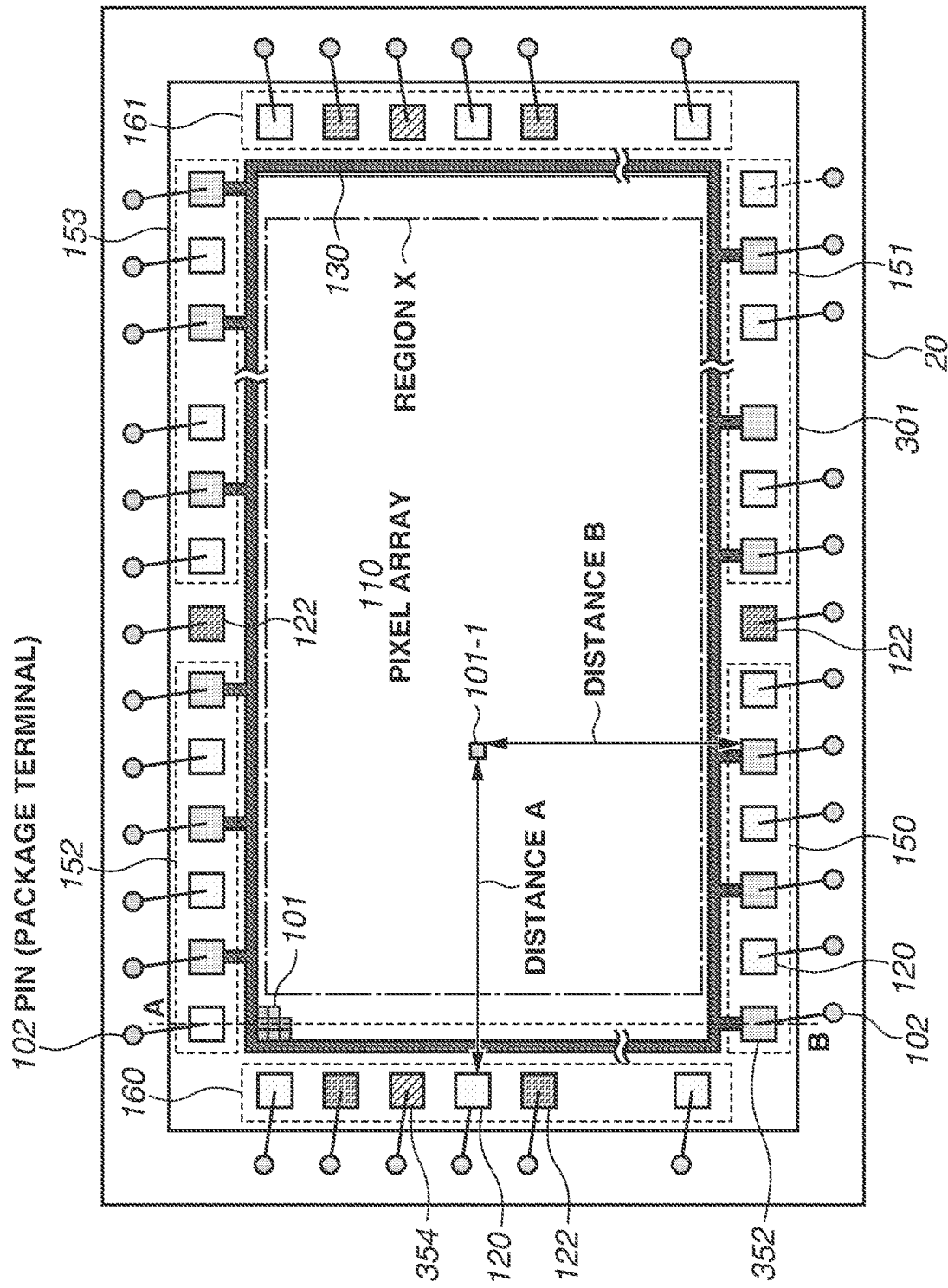
FIG. 6 is a plan view of the semiconductor element.

FIG. 6 illustrates the configurations of a first chip 301 and a package 20 included in the semiconductor element according to the present exemplary embodiment. The first chip 301 has long sides and short sides. The first chip 301 includes a pixel array 110 in which a plurality of pixels 101 is arrayed in rows and columns.

A power source wire 130, which surrounds the periphery of the pixel array 110, is mounted on the first chip 301. The power source wire 130 is connected to a plurality of pad electrodes 352 disposed closer to the end of the first chip 301 than the pixel array 110, outside the pixel array 110. The pad electrodes 352 are an example of a first electrode. The pad electrodes 352 are disposed in regions 150 to 153, which are along the longer sides of the pixel array 110, outside the pixel array 110. More specifically, the pad electrodes 352, to which the power source wire 130 is connected, are disposed in two long-side regions of the first chip 301 on opposite sides of the pixel array 110. This relationship of the two long-side regions on opposite sides of the pixel array 110 means the relationship between the region 150 and the region 152, and the relationship between the region 151 and the region 153. The power source wire 130 is a wire for supplying the power source voltage VH to the pixels 100. Each of the pad electrodes 352 is connected to a pin (a package connection terminal) 102 included in the package 20. The pin 102 receives the power source voltage VH, which is the first voltage supplied from outside the semiconductor element. Further, pad electrodes 120 and pad electrodes 122 are disposed in the long-side regions of the first chip 301 in addition to the pad electrodes 352. The pad electrodes 120, which are an example of a second electrode, are electrodes that receive the power source voltage VL, which is a different voltage from the power source voltage VH and which is the second voltage supplied to the pixels 100. The power source voltage VH, which is the first voltage, is 1.1 V in the present exemplary embodiment. Further, the power source voltage VL, which is the second voltage, is −30 V in the present exemplary embodiment. The pad electrodes 122 are an example of a third electrode, which receives a third voltage different from the power source voltage VH and the power source voltage VL (for example, a ground voltage). In each of the regions 150 to 153, the pad electrodes 120 are disposed between the pad electrodes 352. In another view, in each of the regions 150 to 153, the pad electrodes 352 are disposed between the pad electrodes 120. In yet another view, in each of the regions 150 to 153, the pad electrodes 352 and the pad electrodes 120 are alternately arranged. A pad electrode 122 is disposed between these two regions 150 and 151 in which the pad electrodes 352 and the pad electrodes 120 are alternately arranged. Further, the pad electrode 122 is disposed between a pad electrode 352 and a pad electrode 120.

Further, pad electrodes 354, which are an example of a fourth electrode, are provided in regions 160 and 161 along the short sides of the first chip 301. The pad electrodes 354 each receive a fourth voltage, which is a power source voltage used by the circuit elements of a second chip, which will be described below. Pad electrodes 120, pad electrodes 122, and pad electrodes 354 are disposed in the regions 160 and 161. Each of the pad electrodes 352, 120, and 122 receive the corresponding power source voltage supplied from outside the semiconductor element from the corresponding pin 102.

Figure 7:
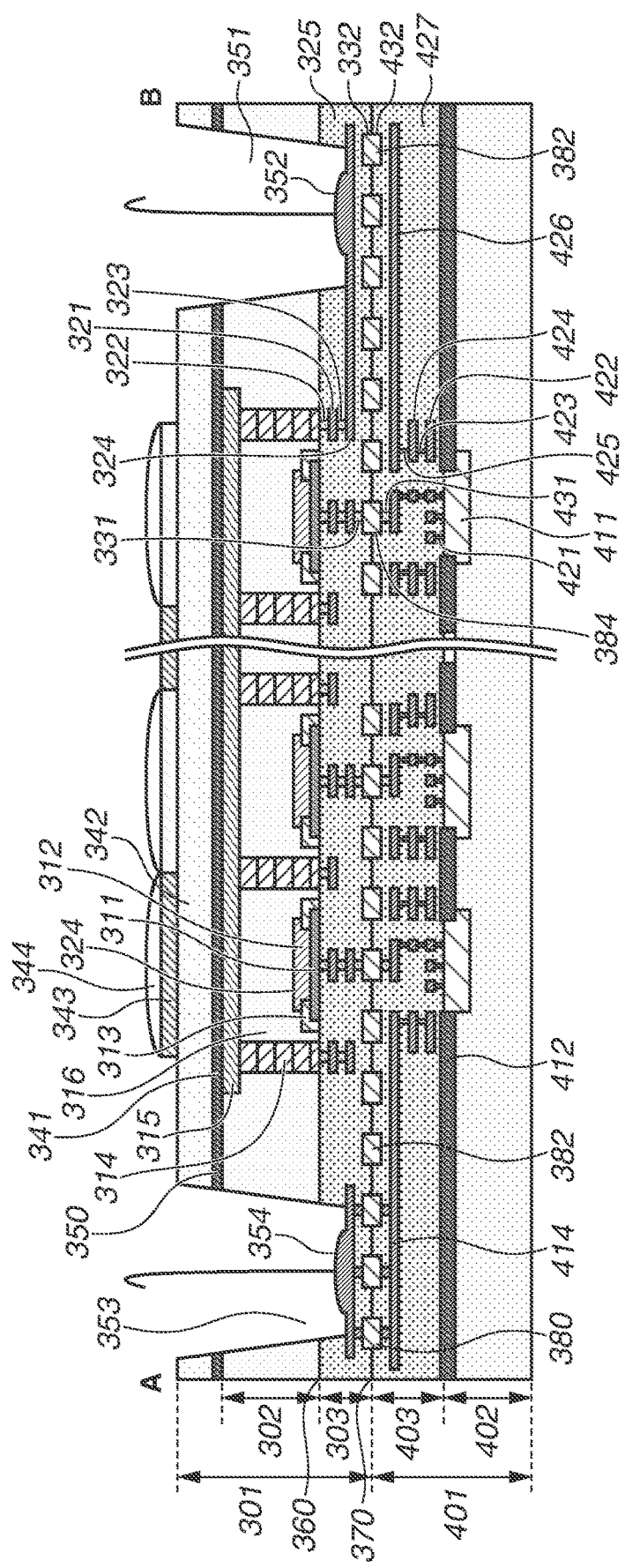
FIG. 7 is a cross-sectional view of the semiconductor element.

FIG. 7 is a cross-sectional view at the position of an A-B line illustrated in FIG. 6. Like numbers in FIG. 7 refer to like components illustrated in FIG. 6.

The first chip 301 includes a first semiconductor layer 302 and a first wiring layer 303. Semiconductor regions included in each pixel 100 are disposed in the first semiconductor layer 302. A first semiconductor region 311 of the first conductivity type, a second semiconductor region 312 of the second conductivity type, and third semiconductor regions 313 of the first conductivity type are disposed where light is incident after passing through a microlens 344 as the semiconductor regions included in the pixel 100. In the case where electrons constitute a signal charge, the first conductivity type is a p type and the second conductivity type is an n type. In the case where holes constitute a signal charge, the first conductivity type is an n type and the second conductivity type is a p type. In the present exemplary embodiment, electrons constitute a signal charge. An avalanche photodiode 331 corresponding to the avalanche photodiode 201 illustrated in FIG. 5A is formed at the first semiconductor region 311 and the second semiconductor region 312.

In the planar view overlooking the first chip 301 from above the upper surface, the microlens 344 overlaps at least parts of the first semiconductor region 311 and the second semiconductor region 312.

The third semiconductor regions 313 are provided on both ends of the first semiconductor region 311, and eases the concentration of an electric field on the first semiconductor region 311. The impurity concentration in the third semiconductor regions 313 is lower than that in the first semiconductor region 311. For example, with an impurity concentration of the first semiconductor region 311 of $6.0 \times 10^{18}$ [atoms/cm$^3$] or higher, the impurity concentration of the third semiconductor region 313 ranges between $1.0 \times 10^{16}$ [atoms/cm$^3$] and $1.0 \times 10^{18}$ [atoms/cm$^3$], inclusively.

A fourth semiconductor region 316 of the second conductivity type is disposed close to a surface 350 deeper than (nearer the incident surface) the second semiconductor region 312. Further, a fifth semiconductor region 314 of the second conductivity type is disposed between the adjacent pixels as an inter-pixel isolation region, and a sixth semiconductor region 315 of the second conductivity type is disposed adjacent to the surface 350 deeper than the fourth semiconductor region 316.

Now, the impurity concentrations of the fifth semiconductor region 314 and the sixth semiconductor region 315 are higher concentrations than that of the fourth semiconductor region 316. This allows charge created through photoelectric conversion in the fourth semiconductor region 316 to be more collected into the avalanche photodiode 324 than to leak into the adjacent pixel, leading the charge generated in the fourth semiconductor to efficient avalanche multiplication.

A pinning film 341 is provided over the upper surface of the sixth semiconductor region 315. This reduces dark current generated near the surface of the semiconductor layer 302.

A planarization layer 342 is provided over the pinning film 341. A color filter layer 343 and the microlens 344 are provided above the planarization layer 342.

The wiring layer 303 is included in the first chip 301. A first wiring layer 321 and a second wiring layer 324 are included in the wiring layer 303. The first wiring layer 321 and the fifth semiconductor region 314 are connected via a contact plug 322 to each other. The first wiring layer 321 and the second wiring layer 324 are connected via a via 323 to each other.

The first chip 301 has an opening portion 351 for exposing the pad electrode 352 in it. The pad electrode 352 is disposed on the bottom surface of the opening portion 351. The opening portion 351 is between the surface 350 (the first surface) and a surface 370 (the second surface) of the first chip 301. As will be described below, the surface 370 is a bonding surface between the first chip 301 and a second chip 401. The pad electrode 352 is connected to the pin 102 illustrated in FIG. 6 via a wire provided in the opening portion 351. If the pad electrode 352 is placed at the uppermost layer of the wiring layer 303, the uppermost layer of the wiring layer 303 may be made of aluminum wiring and the other wiring layer(s) made of copper wiring.

The first chip 301 has an opening portion 353 for exposing the pad electrode 354 in it. The pad electrode 354 is disposed on the bottom surface of the opening portion 353. The opening portion 353 is disposed between the surface 350 (the first surface) and the surface 370 (the second surface) of the first chip 301. As will be described below, the surface 370 is a bonding surface between the first chip 301 and the second chip 401. The pad electrode 354 is connected to the pin 102 illustrated in FIG. 6 via a wire provided in the opening portion 353. If the pad electrode 354 is placed at the uppermost layer of the wiring layer 331, the uppermost layer of the wiring layer 331 may be made of aluminum wiring and the other wiring layer(s) made of copper wiring.

The pad electrode 354 is connected to a wire 414 provided in the second chip 401 via a plurality of bonding portions 380. The wire 414 is connected to other wiring provided in a wiring layer 403 through via holes. The second chip 401 includes circuitry that processes signals output from the first chip 301. The second chip 401 includes a semiconductor layer 402. The semiconductor layer 402 includes seventh semiconductor regions 411. Each seventh semiconductor region 411 is connected to the corresponding first semiconductor region 311 of the first chip 301 via a contact plug 421, a multilayered wire included in the wiring layer 403, a bonding portion 331, and a multilayered wire included in the wiring layer 303. Further, a not-illustrated gate electrode and source and drain regions are provided in the second chip 401, forming one metal-oxide-semiconductor (MOS) transistor. One example of the MOS transistor mounted on the second chip 401 is a quenching element. The quenching element corresponds to the element 202 in FIG. 4, and functions as a load circuit in avalanche multiplication caused by photoelectrically converted charge. The quenching element serves to perform quenching action that curbs the voltage to be supplied to the avalanche photodiode 324, giving lower avalanche multiplication.

An element isolation region 412 is provided between adjacent two MOS transistors. Examples of the element isolation region 412 include local oxidation of silicon (LOCOS) and shallow trench isolation (STI).

Bonding portions 384 provided in the wiring layer 403 of the second chip 401 play a role of transmitting outputs of the avalanche photodiode 331 in the first chip 301 to the second chip 401. These bonding portions is metal wiring such as copper wiring.

A multilayered wiring layer 431 (a second multilayered wiring layer) is provided in the wiring layer 403 of the second chip 401. The multilayered wiring layer 431 includes, for example, wiring for sending signals transmitted from the first chip 301 to processing circuitry in the second chip 401, or power source wiring or ground wiring for driving the signal processing unit 103 mounted in the second chip 401.

A not-illustrated ground region may be provided in the semiconductor layer 411 of the second chip 401. The voltage of a ground potential (a ground voltage; the third voltage) is supplied from each pad electrode 122 illustrated in FIG. 6 to the ground region. The ground region to which the voltage applied from each pad electrode 122 is supplied may be excluded. In that case, the voltage applied from each pad electrode 122 is directly supplied to another circuit element.

Further, the power source voltage VH is supplied to each semiconductor region 411 disposed in the second chip 401 via the pad electrode 354 disposed at the bottom portion of the opening portion 353 and a not-illustrated quenching element.

Effects of the present exemplary embodiment will be described. As illustrated in FIG. 6, the pad electrodes 352, which receive the first voltage to be supplied to the pixels 100, are disposed in the regions along the long sides of the first chip 301. FIG. 6 illustrates a pixel 100-1 as an example. A distance A between the pixel 100-1 and the pad electrode in one short-side region is longer than a distance B between the pixel 100-1 and the pad electrode on one long-side region. The pixels 100 in the range of a region X surrounded by the dot-dash line have such the relationship that the distance between a pixel and the corresponding pad electrode pad in the corresponding long-side region is shorter than the distance between the pixel and the corresponding pad electrode in the corresponding short-side region. That means that placing the pad electrodes supplying the power source voltage to the pixels 100 arranged in rows and columns in the long-side regions leads to a reduction in the distance of transmitting the power source voltage. This reduction in the distance of transmitting the power source voltage is beneficial to a reduction of the power source voltage drop and stabilization of the power source voltage in a semiconductor element prone to fluctuation in the power source voltage due to avalanche multiplication.

Further, in the present exemplary embodiment, the number of pad electrodes 352 disposed on the first chip 301 is larger than that of pad electrodes 122, which receive the third voltage. More pad electrodes reduces the number of pixels 100 that correspond to one pad electrode 352. This allows electric current flowing to pad electrodes 352 caused by avalanche multiplication in one pixel 100 to be levelled out. This means a reduction of variations in power source voltage supplied to other pixels caused by avalanche multiplication in one pixel 100 and a crosstalk reduction. Typically, it is effective that the pixels 100 arranged in ten to 200 columns correspond to one pad electrode 352. It is more effective that the pixels 100 arranged in 50 to 100 columns correspond to one pad electrode 352. Similarly, the pad electrodes 120, which receive the second voltage, are also disposed in the regions along the long sides of the first chip 301. Further, the number of pad electrodes 120 is larger than that of pad electrodes 122. This is beneficial to a reduction of variations in power source voltage (stabilization) and a crosstalk reduction, similarly to the pad electrodes 352. Further, the layout of one pad electrode 120 between a plurality of pad electrodes 352 reduces positional irregularity between them. In another view, one pad electrode 352 is disposed between a plurality of pad electrodes 120. If a plurality of pad electrodes 352 alone were arranged in the region 150 and a plurality of pad electrodes 120 alone were arranged in the region 151, the first voltage would be supplied from the region 150 and the second voltage would be supplied from the region 151. That layout would cause positional irregularity depending on the position of the pixel in the pixel array 110. The present exemplary embodiment reduces the irregularity. Furthermore, the region 150, which is closer to one short side with respect to the center line parallel to the short sides of the pixel array 110, and the region 151, which is closer to the other short side with respect to the center line, are disposed along one long side of the pixel array 110. Both in the region 150 and in the region 151, the region to place one pad electrode 120 in is provided between a plurality of pad electrodes 352. In another view, one pad electrode 352 is disposed between a plurality of pad electrodes 120. That contributes to a reduction of variations of supply of the first voltage and the second voltage depending on the position of the pixel in the pixel array 110.

As described above, the semiconductor element discussed in the present exemplary embodiment has beneficial effects of a stable supply of power source voltage and a crosstalk reduction.

OTHER EXAMPLES

The first exemplary embodiment has been described citing the example in which one pad electrodes 120 is disposed between a plurality of pad electrodes 352, but the semiconductor element is not limited to this example and one pad electrode 122 or one pad electrode 354 may be disposed between a plurality of pad electrodes 352. This case can also be said to be a configuration in which one second electrode is disposed between a plurality of first electrodes. Alternatively, one pad electrode 122 or one pad electrode 354 may be disposed between a plurality of pad electrodes 120.

Further, pad electrodes 352 may also be disposed in regions along the short sides. In this case, the pads 352 in the short-side regions are also connected to the power source wire 130.

Figure 8:
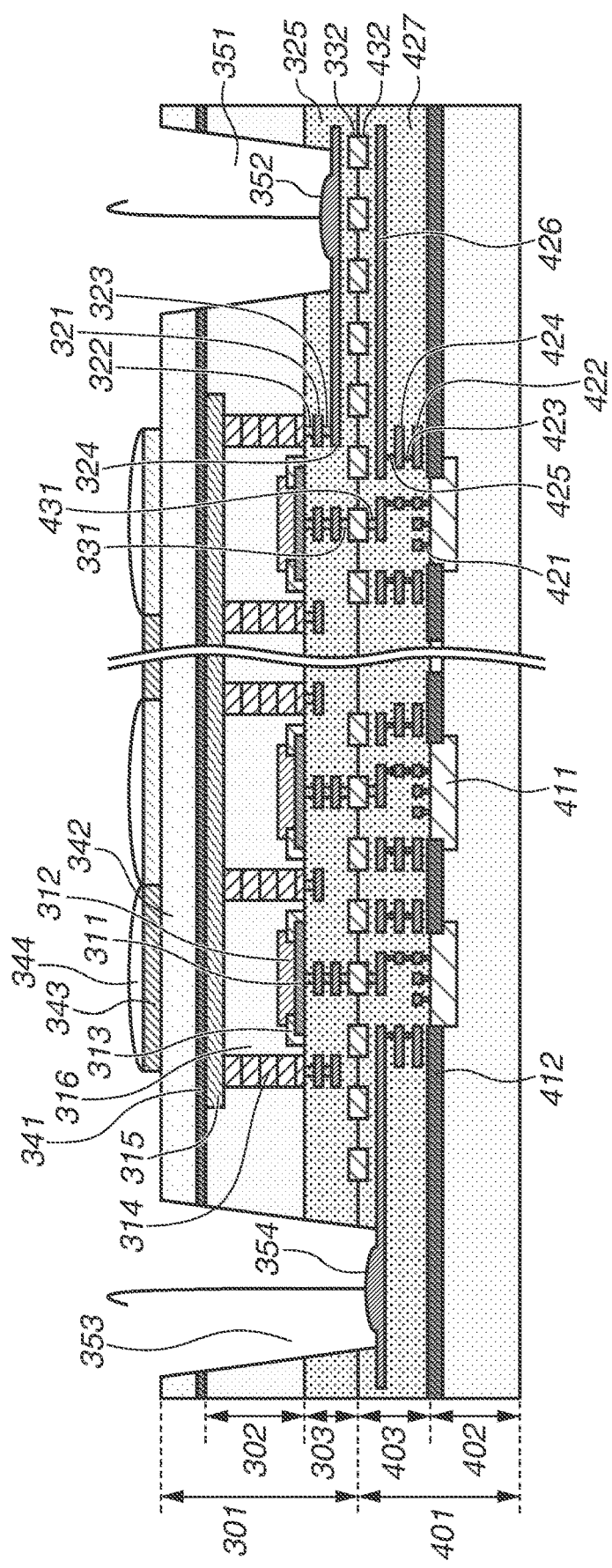
FIG. 8 is a cross-sectional view of the semiconductor element.

The first exemplary embodiment has been described citing the example in which the pad electrodes 354 are disposed on the first chip 301, but the pad electrodes 354 may be disposed on the second chip 401 as illustrated in FIG. 8. The pad electrodes 354 are electrodes to receive a power source voltage that the circuitry mounted on the second chip 401 uses, and the pad electrodes 354 on the second chip 401 shortens the power supply route.

Figure 9:
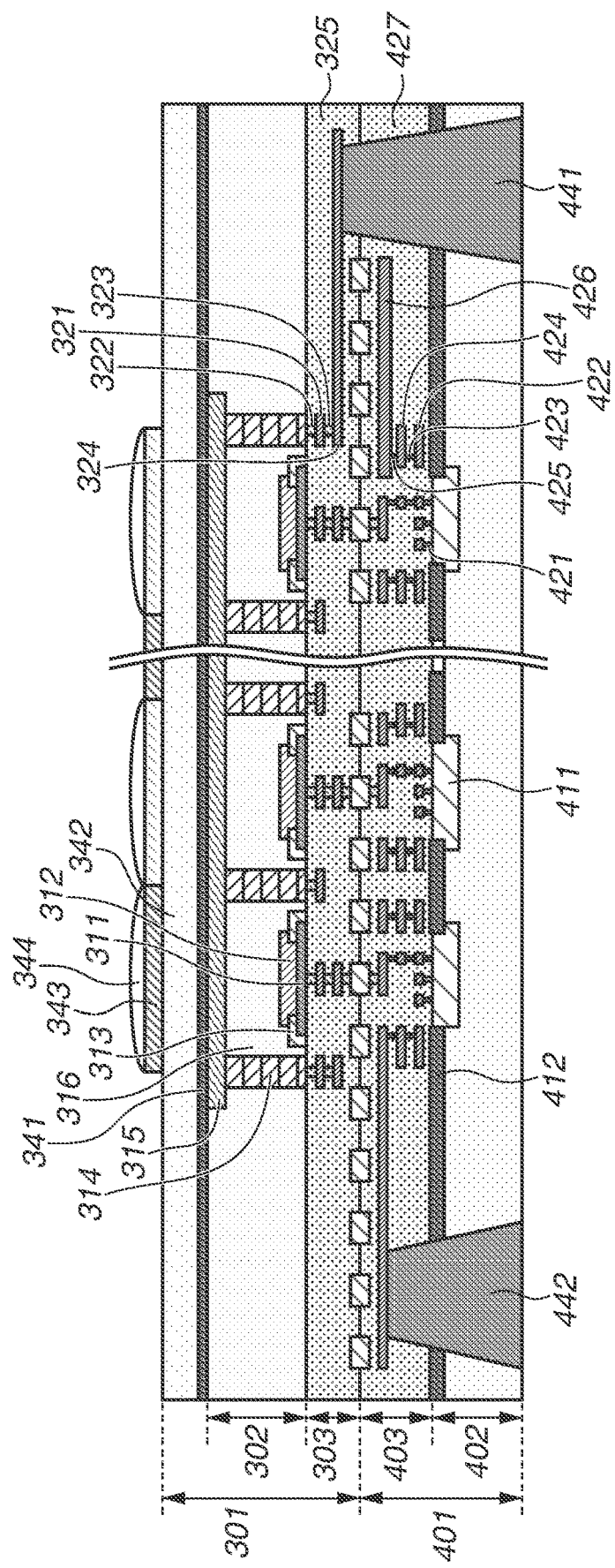
FIG. 9 is a cross-sectional view of the semiconductor element.

Further, as illustrated in FIG. 9, the semiconductor element may be configured to include embedded electrodes 441 and 442, which penetrate through the semiconductor layer 402 and the wiring 403 to receive power source voltage from outside the semiconductor element. This eliminates the need for providing the pad opening portions, reducing the area of the electrode portion to receive the power source voltage. As a result, this configuration is beneficial to a size reduction of the semiconductor element.

Figure 10:
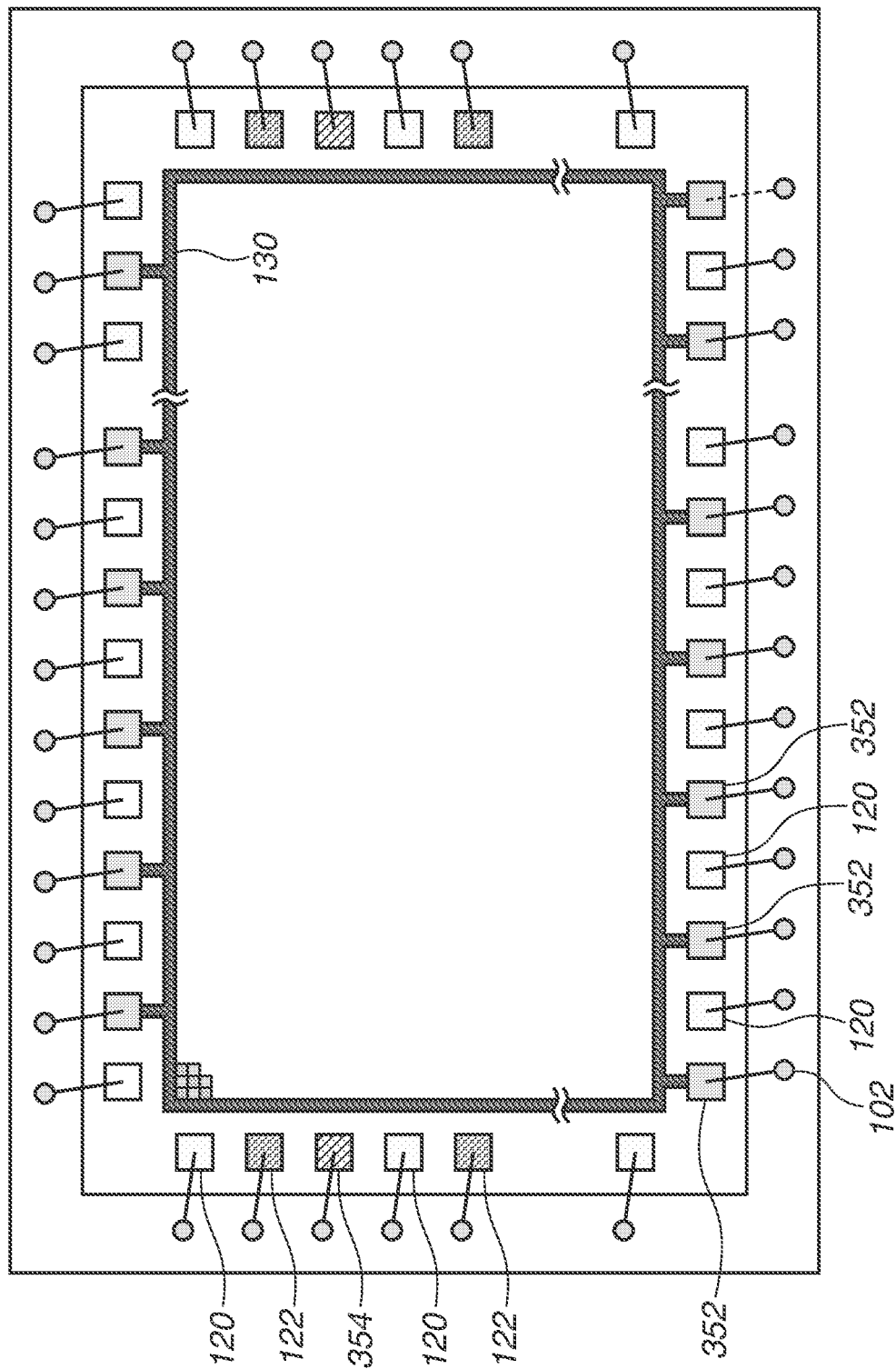
FIG. 10 is a plan view of the semiconductor element.

Further, one pad electrode 122, which receives the third voltage, is disposed between one pad electrode 120 and one pad electrode 352 in the first exemplary embodiment, but no pad electrodes 122 may be mounted on as illustrated in FIG. 10.

Figure 11:
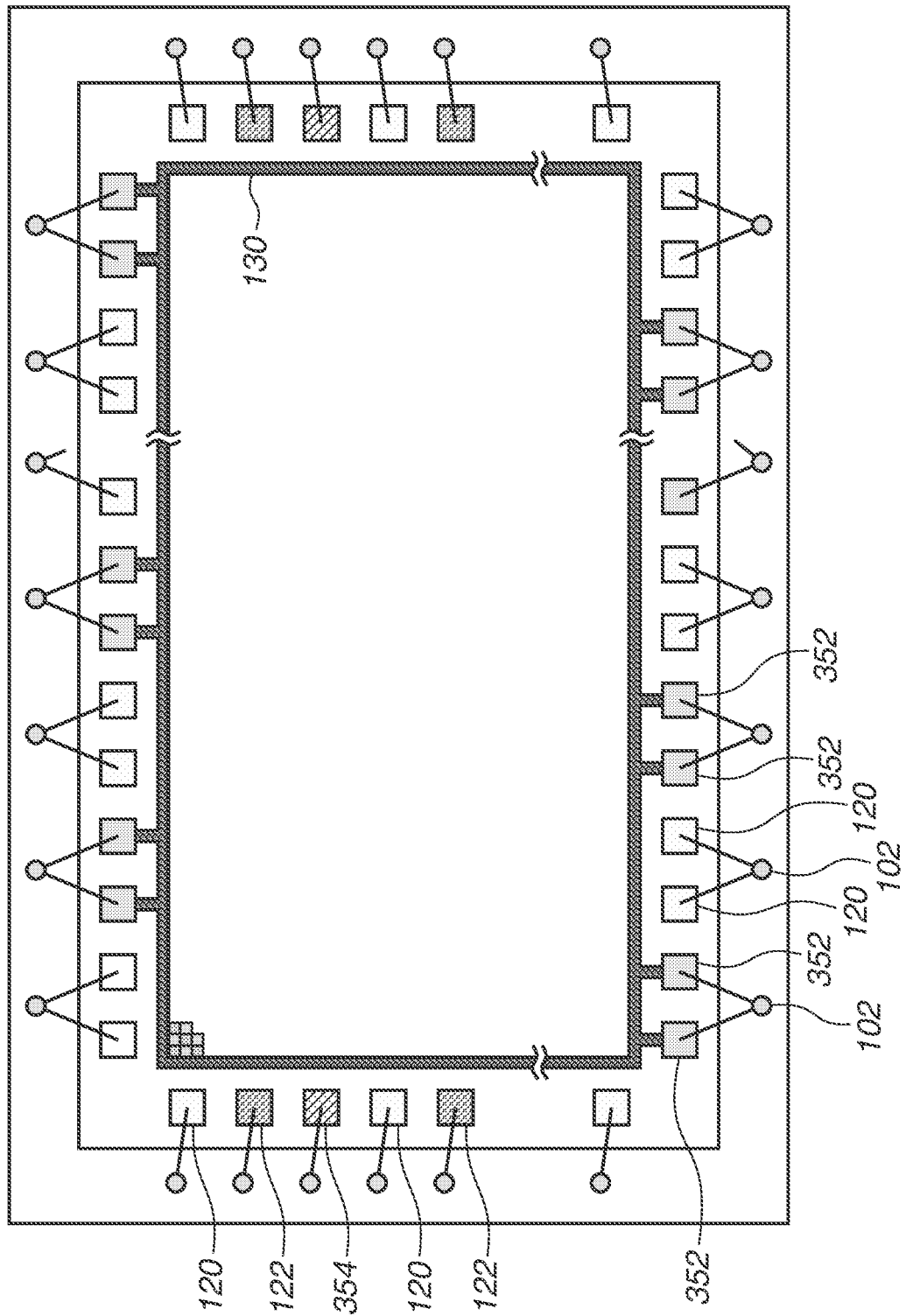
FIG. 11 is a plan view of the semiconductor element.
Figure 12:
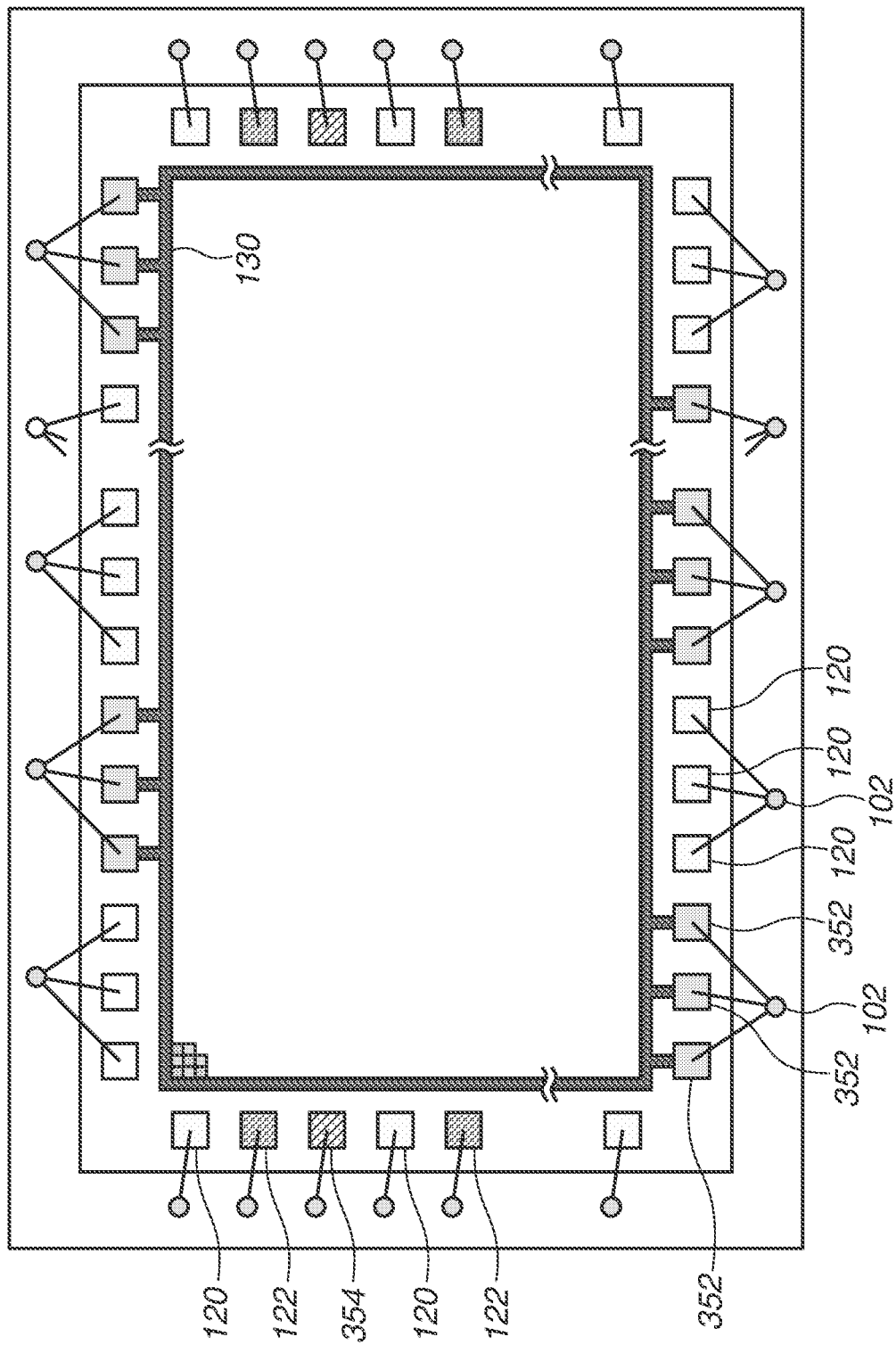
FIG. 12 is a plan view of the semiconductor element.

Further, a plurality of pad electrodes 352 and a plurality of pad electrodes 120 are alternately arranged one by one in the first exemplary embodiment, but a group including a plurality of pad electrodes 352 arranged next to each other and a group including a plurality of pad electrodes 120 arranged next to each other may be alternately disposed group by group as illustrated in FIG. 11. In the example illustrated in FIG. 11, double bonding in which a plurality of pad electrodes is connected to one pin is employed. Alternatively, as illustrated in FIG. 12, each of these groups includes three or more pad electrodes. In the example illustrated in FIG. 12, triple bonding in which three or more pad electrodes are connected to one pin is employed. Single bonding, double bonding, and triple bounding may be combined as appropriate.

Figure 13:
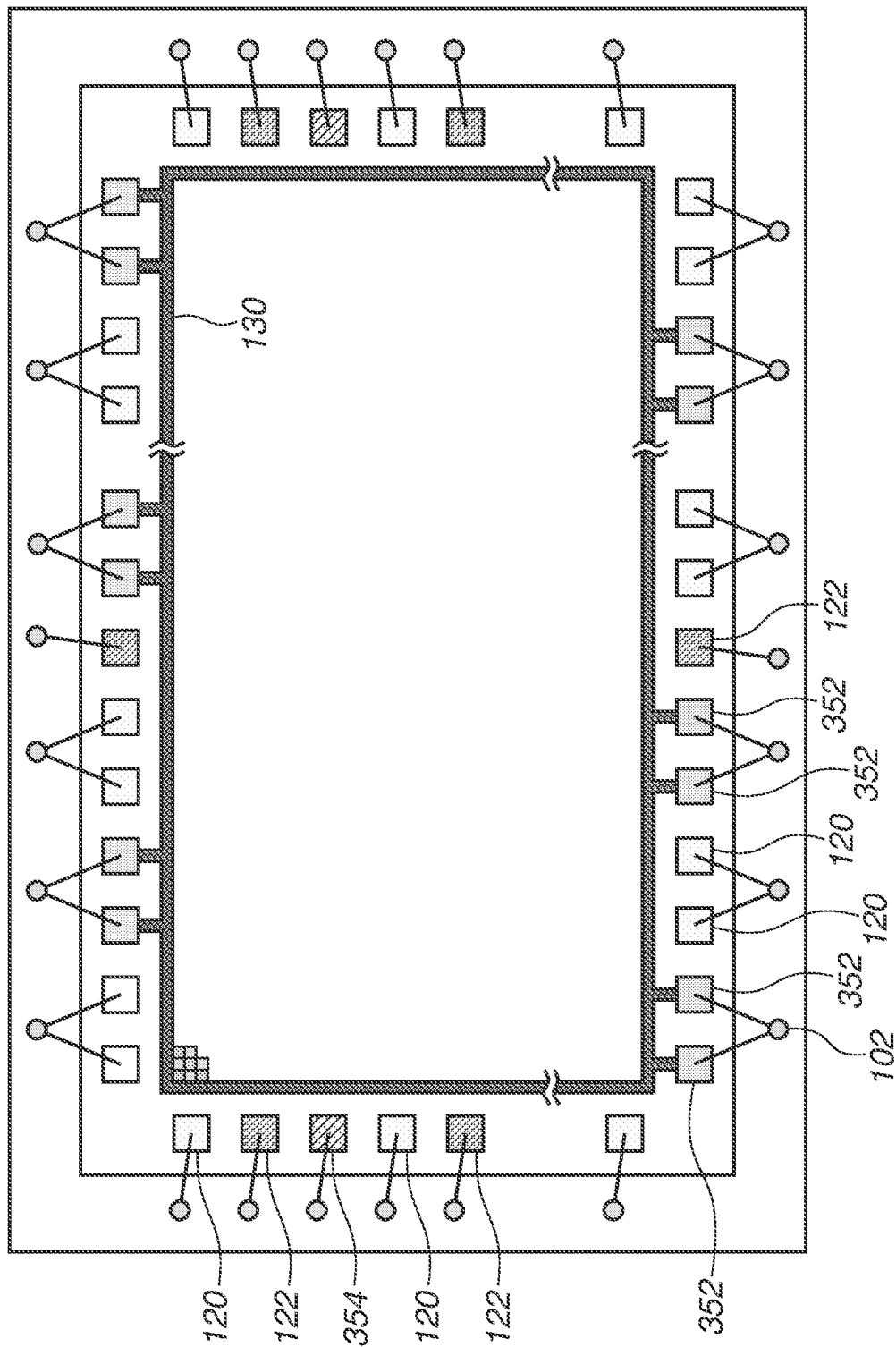
FIG. 13 is a plan view of the semiconductor element.

Further, the pad electrodes 352 and the pad electrodes 120 are alternately arranged one by one in the first exemplary embodiment, but a group including a plurality of pad electrodes 352 arranged next to each other and a group including a plurality of pad electrodes 120 arranged next to each other are alternately disposed group by group as illustrated in FIG. 13. Then, in FIG. 13, one pad electrode 122 to which the third voltage is supplied is disposed between two groups.

Figure 14:
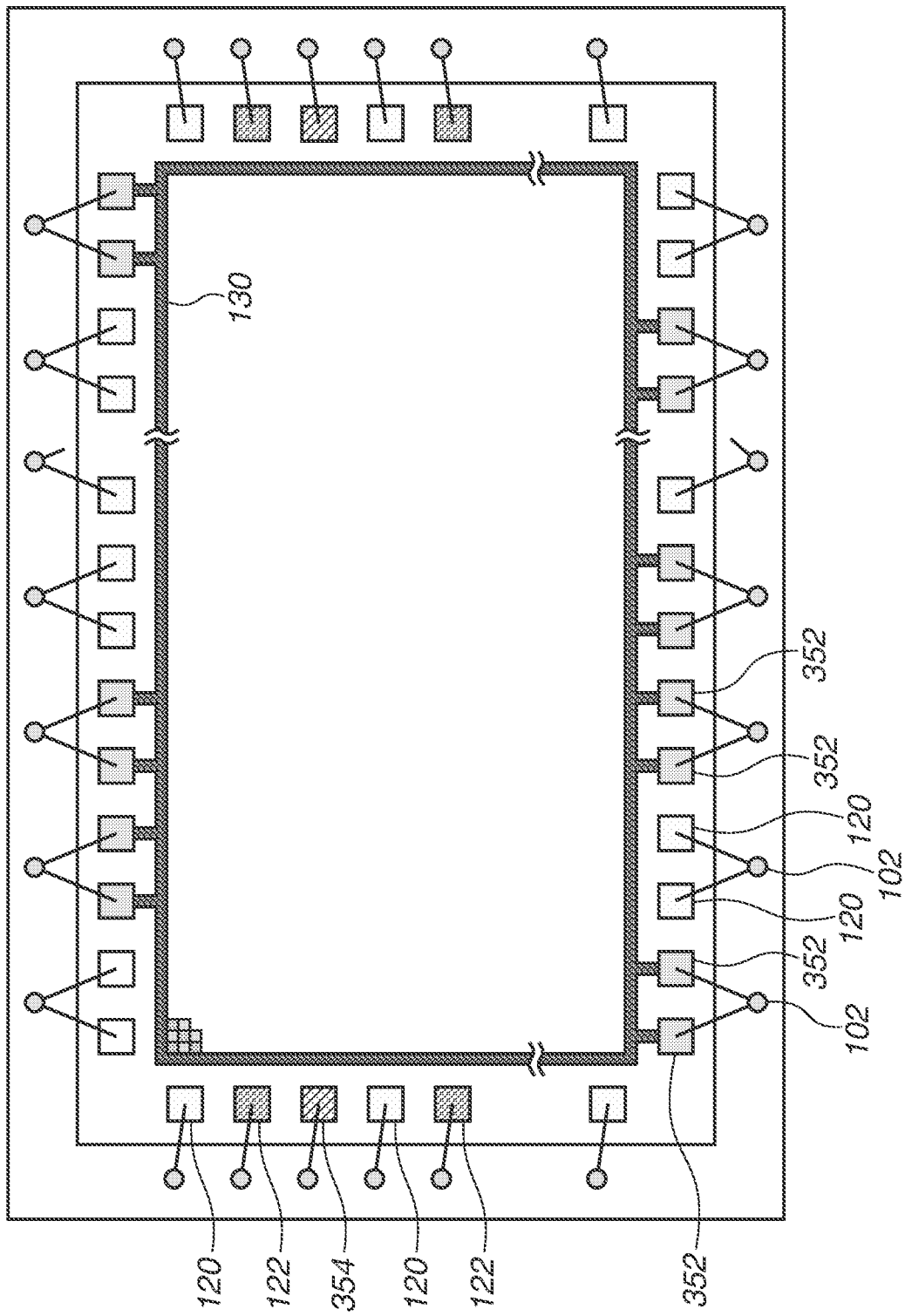
FIG. 14 is a plan view of the semiconductor element.

Further, as illustrated in FIG. 14, with a plurality of pad electrodes 352 connected to one pin, one pad electrode 352 connected to one pin and another pad electrode 352 connected to another pin are located next to each other. This configuration includes regions in which one pad electrode 352 and one pad electrode 120 are located next to each other.

Figure 15:
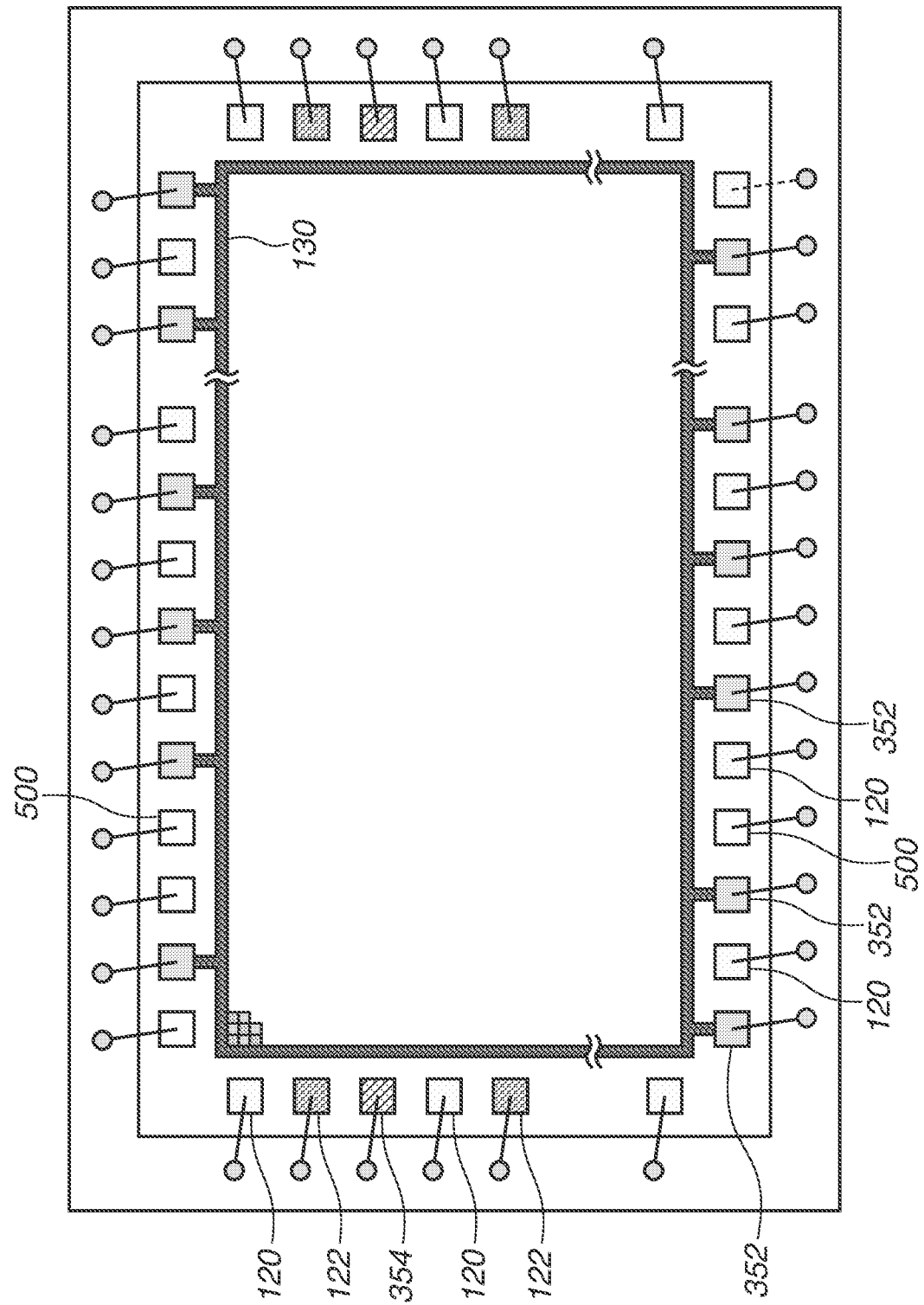
FIG. 15 is a plan view of the semiconductor element.

Further, as illustrated in FIG. 15, a dummy pad electrode 500 may be disposed in a long-side region. Each dummy pad 500 may be connected to a pin or may not. The potential of a pad electrode 500 may be floating or a predetermined voltage supplied thereto.

An arithmetic element to perform, for example, image processing, signal arithmetic processing, and/or arithmetic operation using a neural network updated as appropriate may be further mounted on the second chip 401 in addition to circuitry to process signals output from the pixel array 110.

Further, the present exemplary embodiment has been described regarding the semiconductor element in which the first chip 301 and the second chip 401 are laminated, but the semiconductor element may be a non-laminated chip in which the pixel array 110 and circuitry to process signals output from the pixel array 110 are mounted on a single chip.

Further, the present exemplary embodiment has been described regarding the semiconductor element in which the first chip 301 and the second chip 401 are laminated, but another chip may be further laminated. A storage member such as a memory element, and/or an arithmetic element to perform, for example, image processing, signal arithmetic processing, and/or arithmetic operation using a neural network updated as appropriate may be mounted on the chip.

As described above, the semiconductor elements described in the present exemplary embodiment and the other examples have beneficial effects of a stable power source voltage and a crosstalk reduction.

Figure 16A:
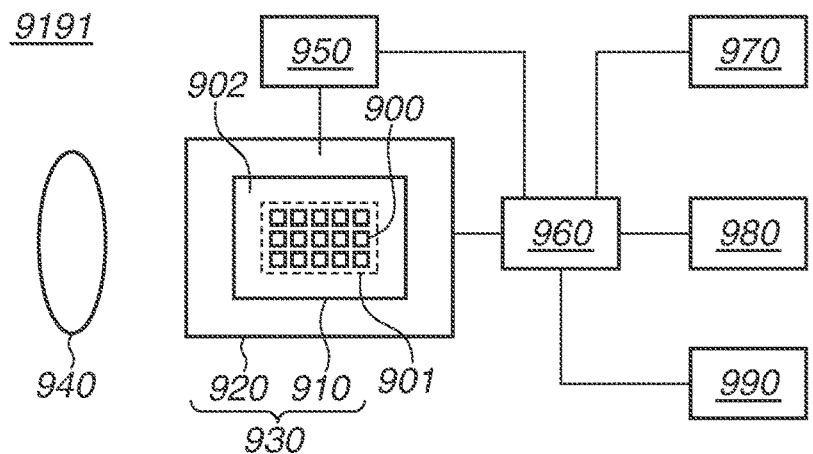
FIGS. 16A to 16C illustrate the configuration of an apparatus.
Figure 16B:
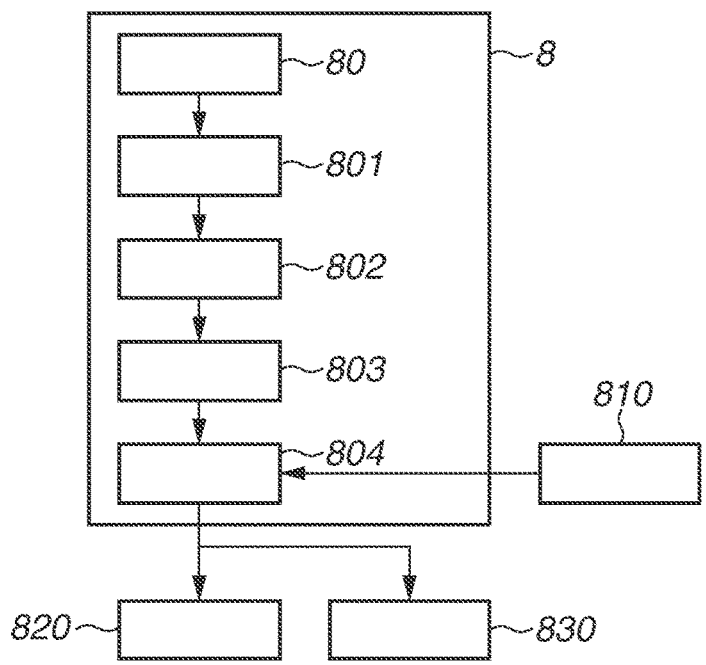
Figure 16C:
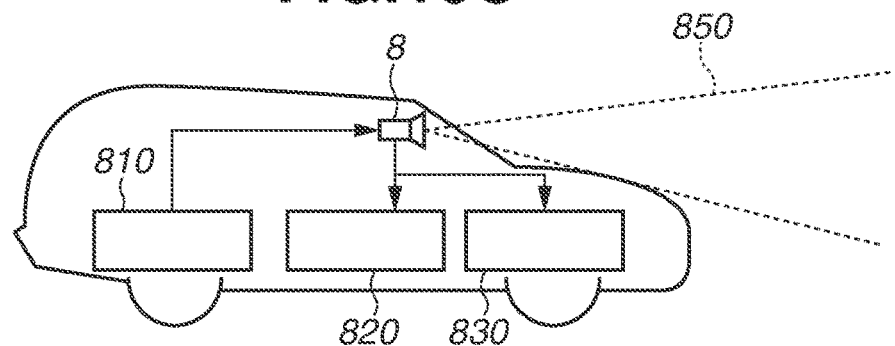

A second exemplary embodiment will be described. The present exemplary embodiment is applicable to any of the semiconductor elements described in the first exemplary embodiment and the other examples. FIG. 16A is a schematic view illustrating an apparatus 9191 including a semiconductor apparatus 930 according to the present exemplary embodiment. The apparatus 9191 including the semiconductor apparatus 930 will be described in detail. The semiconductor apparatus 930 includes a package 920 containing a semiconductor device 910 in addition to the semiconductor device 910 as described above. The package 920 can include a substrate to which the semiconductor device 910 is fixed, and a cover member such as glass facing the semiconductor device 910. The package 920 can further include a bonding member such as a bonding wire and a bump connecting a terminal provided on the substrate and a terminal provided on the semiconductor device 910. The semiconductor device 910 and the package 920 can be applied as the semiconductor elements described in the first exemplary embodiment and the other examples.

The apparatus 9191 can include at least one of an optical device 940, a control device 950, a processing device 960, a display device 970, a storage device 980, or a mechanical device 990. The optical device 940 corresponds to the semiconductor apparatus 930. The optical device 940 is, for example, a lens, a shutter, and/or a mirror. The control device 950 controls the semiconductor apparatus 930. The control device 950 is, for example, a semiconductor device such as an application specific integrated circuit (ASIC).

The processing device 960 processes signals output from the semiconductor apparatus 930. The processing device 960 is a semiconductor device such as a central processing unit (CPU) and an ASIC for an analog front end (AFE) or a digital front end (DFE). The display device 970 is an electro-luminescence (EL) display device or a liquid crystal display device to display information (images) acquired by the semiconductor apparatus 930. The storage device 980 is a magnetic device or a semiconductor device to store information (images) acquired by the semiconductor apparatus 930. The storage device 980 is a volatile memory such as a static random access memory (SRAM) and a dynamic random access memory (DRAM), or a nonvolatile memory such as a flash memory and a hard disk drive.

The mechanical device 990 includes a moving unit or a thrust unit, such as a motor and an engine. The apparatus 9191 displays signals output from the semiconductor apparatus 930 on the display device 970 or transmits signals to the outside using a communication device (not illustrated) included in the apparatus 9191. It is suitable that the apparatus 9191 further includes the storage device 980 and the processing device 960 in addition to a storage circuit and an arithmetic circuit included in the semiconductor apparatus 930. The mechanical device 990 may be controlled based on signals output from the semiconductor apparatus 930.

Further, the apparatus 9191 is suitable to an electronic apparatus such as an information terminal provided with an imaging function (for example, a smartphone or a wearable terminal) and a camera (for example, an interchangeable-lens camera, a compact camera, a video camcorder, and a monitoring camera). The mechanical device 990 in a camera can drive components in the optical device 940 in zooming, focusing, and shutter operation. Alternatively, the mechanical device 990 in a camera can move the semiconductor apparatus 930 in vibration damping operation.

Further, the apparatus 9191 can be a transportation apparatus, such as a vehicle, a ship, and a flight vehicle. The mechanical device 990 in a transportation apparatus can be used as a movement device. The apparatus 9191 as a transportation apparatus is effectively usable for an apparatus on which the semiconductor apparatus 930 is transported or an apparatus in assisting in and/or automating driving (maneuvering) using the imaging function. The processing device 960 used in assisting in and/or automating driving (maneuvering) can perform processing for operating the mechanical device 990 as a movement device based on information acquired by the semiconductor apparatus 930.

Alternatively, the apparatus 9191 may be a medical appliance such as an endoscope, a measurement instrument such as a ranging sensor, an analytical instrument such as an electronic microscope, an office machine such as a copying machine, or industrial equipment such as a robot.

According to the above-described exemplary embodiment, the configuration provides an excellent pixel characteristic to enhance the value of the semiconductor apparatus Enhancing the value described herein refers to at least one of the addition of a function, the improvement of performance, the improvement of a characteristic, the improvement of reliability, the improvement of manufacturing yield, reduction of environmental load, cost reduction, size reduction, or weight reduction.

As a result, the inclusion of the semiconductor apparatus 930 according to the present exemplary embodiment in the apparatus 9191 leads to the improvement of the value of the apparatus 9191. For example, the semiconductor apparatus 930 included in a transportation apparatus provides an excellent performance in capturing images outside the transportation apparatus or measuring the external environment. Thus, the inclusion of the semiconductor apparatus 930 according to the present exemplary embodiment in a transportation apparatus is beneficial to enhancement of the performance of the transportation apparatus. Especially, the semiconductor apparatus 930 is suitable for such a transportation apparatus to use information acquired by a semiconductor apparatus to assist in driving itself and/or perform automated driving.

The above-described exemplary embodiments can be changed as appropriate within the range that does not depart from the technical idea. The content disclosed in the present specification include the content stipulated in the present specification and all features comprehensible from the present specification and the drawings accompanying the present specification. Further, the content disclosed in the present specification include complementary sets of the concepts described in the present specification. More specifically, for example, if the present specification contains a description "A is larger than B", the present specification shall be deemed to also contain a disclosure "A is not larger than B" even if the description "A is not larger than B" is omitted. This is because the presence of the description "A is larger than B" is based on the premise that consideration has been given to the case that "A is not larger than B".

The present disclosure contributes to providing stable supply of the voltage to an avalanche photodiode and, even with the number of avalanche photodiodes increasing, to a plurality of avalanche photodiodes.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-008441, filed Jan. 22, 2021, which is hereby incorporated by reference herein in its entirety.

What is claimed is:

1. A semiconductor element including an array in which a plurality of avalanche photodiodes is arranged, the semiconductor element comprising;
   a plurality of first electrodes configured to receive supply of a first voltage to be used by the plurality of avalanche photodiodes from outside; and
   at least one second electrode configured to receive supply of a second voltage from outside different from the first voltage,
   wherein the plurality of first electrodes and the at least one second electrode are disposed outside the array, and
   wherein the at least one second electrode is disposed between one and another one of the plurality of first electrodes,
   wherein the semiconductor element has at least one long side and at least one short side on a periphery thereof,
   wherein the plurality of first electrodes and the at least one second electrode are disposed in a region located outside the array and along the at least one long side,
   wherein the at least one long side comprises two long sides, and the at least one short side comprises two short sides, and
   wherein the plurality of first electrodes and the at least one second electrode are disposed in each of the regions along the two long sides.

2. The semiconductor element according to claim 1, wherein the region along the at least one long side includes a first region, which is a region closer to one of the two short sides than a line passing through a center of the array along a direction of extending the one of the two short sides, and a second region closer to another one of the two short sides than the line, and
   wherein the at least one second electrode is disposed between the one and the another one of the plurality of first electrodes in each of the first region and the second region.

3. The semiconductor element according to claim 1, further comprising a wire disposed along the periphery of the array,
   wherein the plurality of first electrodes in the region along one of the two long sides and the plurality of first electrodes in the region along another one of the long sides are connected to the wire.

4. The semiconductor element according to claim 1, wherein the at least one second electrode comprises a plurality of second electrodes, and
   wherein a plurality of groups each including the plurality of first electrodes and the plurality of second electrodes is disposed in the region along the at least one long side.

5. The semiconductor element according to claim 4, wherein a third electrode is disposed between one and another one of the plurality of groups, the third electrode being configured to receive a third voltage from outside different from the first voltage and the second voltage.

6. The semiconductor element according to claim 4, wherein the plurality of groups each includes a plurality of first electrodes adjacent to each other and a plurality of second electrodes adjacent to each other, and one of the plurality of first electrodes adjacent to each other and one of the plurality of second electrodes adjacent to each other are located adjacent to each other.

7. The semiconductor element according to claim 1, further comprising a fourth electrode configured to receive supply of a fourth voltage different from the first voltage and the second voltage, wherein the fourth electrode is disposed in the region along the at least one short side.

8. The semiconductor element according to claim 1, wherein the semiconductor element has a structure in which a first chip including the array and a second chip including a circuit configured to process a signal output from the first chip are laminated.

9. The semiconductor element according to claim 8, wherein the plurality of first electrodes and the at least one second electrode are mounted on the first chip.

10. The semiconductor element according to claim 8, further comprising a plurality of bonding portions to which the first chip and the second chip are electrically connected,
    wherein the second chip includes a semiconductor region in which a quenching element is disposed, and the semiconductor region is connected to one of the plurality of avalanche photodiodes via one of the plurality of bonding portions,
    wherein a difference between the second voltage and a ground voltage is smaller than a difference between the first voltage and the ground voltage, and the second voltage is supplied to the semiconductor region via the at least one second electrode and another one of the plurality of bonding portions, and
    wherein the second voltage is supplied from the semiconductor region to the one of the plurality of avalanche photodiodes via the another one of the plurality of bonding portions.

11. The semiconductor element according to claim 10, further comprising a fourth electrode configured to receive supply of a fourth voltage different from the first voltage and the second voltage,
    wherein the fourth electrode is connected to the circuit of the second chip via one of the plurality of bonding portions.

12. The semiconductor element according to claim 8, further comprising a fourth electrode mounted on the second chip, the fourth electrode being configured to receive supply of a fourth voltage different from the first voltage and the second voltage, the fourth electrode being connected to the circuit of the second chip.

13. The semiconductor element according to claim 1, wherein each of the plurality of first electrodes is connected to at least one pin via at least one wire, and the first voltage is supplied from outside to the at least one pin.

14. The semiconductor element according to claim 13,
    wherein the at least one wire comprises a plurality of wires, and
    wherein each of the plurality of first electrodes is connected to a corresponding one of the plurality of wires, and the plurality of wires is connected to one of the at least one pin.

15. The semiconductor element according to claim 13,
    wherein the at least one pin comprises a plurality of pins, and the at least one wire comprises a plurality of wires, and
    wherein each of the plurality of first electrodes is connected to a corresponding one of the plurality of wires, and each of the plurality of wires is connected to a corresponding one of the plurality of pins different from one another.

16. The semiconductor element according to claim 1, wherein the second voltage is a voltage supplied to the plurality of avalanche photodiodes.

17. An apparatus including the semiconductor element according to claim 1, further comprising at least any one of:
    an optical device corresponding to the semiconductor element;
    a control device configured to control the semiconductor element;
    a processing device configured to process a signal output from the semiconductor element;
    a display device configured to display information acquired by the semiconductor element;
    a storage device configured to store the information acquired by the semiconductor element; or
    a mechanical device configured to operate based on the information acquired by the semiconductor element.

18. A chip including an array in which a plurality of avalanche photodiodes is arranged, the chip comprising;
    a plurality of first electrodes configured to receive supply of a first voltage to be used by the plurality of avalanche photodiodes from outside; and
    a second electrode configured to receive supply of a second voltage from outside different from the first voltage,
    wherein the plurality of first electrodes and the second electrode are disposed outside the array,
    wherein the second electrode is disposed between one and another one of the plurality of first electrodes,
    wherein the chip is used to be laminated with another chip,
    wherein the chip comprises two long sides,
    wherein the plurality of first electrodes and the second electrode are disposed in a region located outside the array and along the two long sides, and
    wherein the plurality of first electrodes and the second electrode are disposed in each of the regions along the two long sides.

* * * * *